Figure 1:
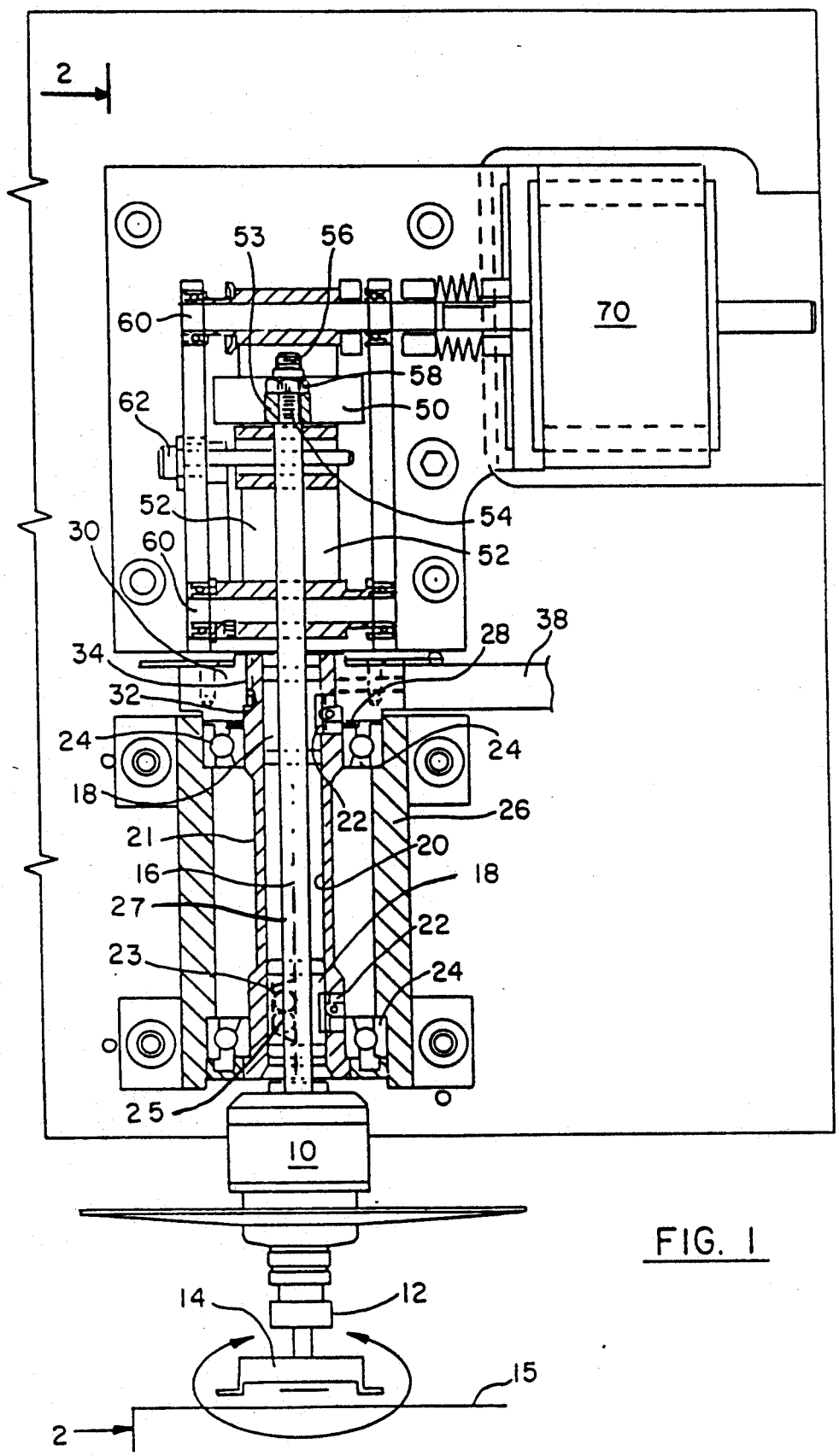

United States Patent
Rossmeisl et al.

[11] Patent Number: 5,251,946
[45] Date of Patent: Oct. 12, 1993

[54] COMPOUND TOOL DRIVE

[75] Inventors: Mark E. Rossmeisl, Beverly; Arthur L. Gaudette, Ipswich, both of Mass.

[73] Assignee: Emhart Inc., Newark, Del.

[21] Appl. No.: 823,196

[22] Filed: Jan. 21, 1992

[51] Int. Cl.⁵ .................. B66C 1/02; H05K 3/00
[52] U.S. Cl. .................... 294/64.1; 29/743
[58] Field of Search .......... 294/2, 64.1, 65, 88; 414/737, 752; 29/743; 901/40

[56] References Cited

U.S. PATENT DOCUMENTS

| | | | |
|---|---|---|---|
| 4,611,397 | 9/1986 | Janisiewicz et al. | 294/2 X |
| 4,759,124 | 7/1988 | Snyder et al. | 294/64.1 X |
| 4,799,803 | 1/1989 | Tanaka | 384/43 |
| 4,860,438 | 8/1989 | Chen | 294/2 X |
| 5,018,936 | 5/1991 | Izumi et al. | 901/40 X |
| 5,056,844 | 10/1991 | Takabayashi | 294/2 X |

FOREIGN PATENT DOCUMENTS 1364592 1/1988 U.S.S.R. .................. 294/2

Primary Examiner—David M. Mitchell
Assistant Examiner—Dean J. Kramer
Attorney, Agent, or Firm—Spencer T. Smith

[57] ABSTRACT

A machine for placing surface mount electronic components has a tool holder that is vertically displaceable and rotatable to pick-up and deposit components. The tool holder can be conjointly axially advanced and rotated to improve the productivity of the system.

3 Claims, 2 Drawing Sheets

COMPOUND TOOL DRIVE

The present invention relates to machines for placing electronic surface mount components on a printed circuit board.

Conventionally, surface mount components are picked up by vertically lowering (Z motion) a tool head holding a vacuum tool into engagement with a component at a feed location. The tool head is then elevated and rotationally oriented (theta motion) to properly orient the component and then vertically downwardly lowered to place the oriented component on the circuit board. The tool head and printed circuit board are relatively displaced horizontally (X,Y) to locate the tool over the location on the circuit board which is to receive the component. Such Z and theta motions are conventionally completed sequentially.

It is an object of the present invention to provide a improved tool head drive where Z and theta motions can be completed simultaneously. This will increase the productivity of the machine.

Other objects and advantages of the present invention will become apparent from the following portion of this specification and from the accompanying drawings which illustrate in accordance with the mandate of the patent statutes a presently preferred embodiment incorporating the principles of the invention.

Figure 2:
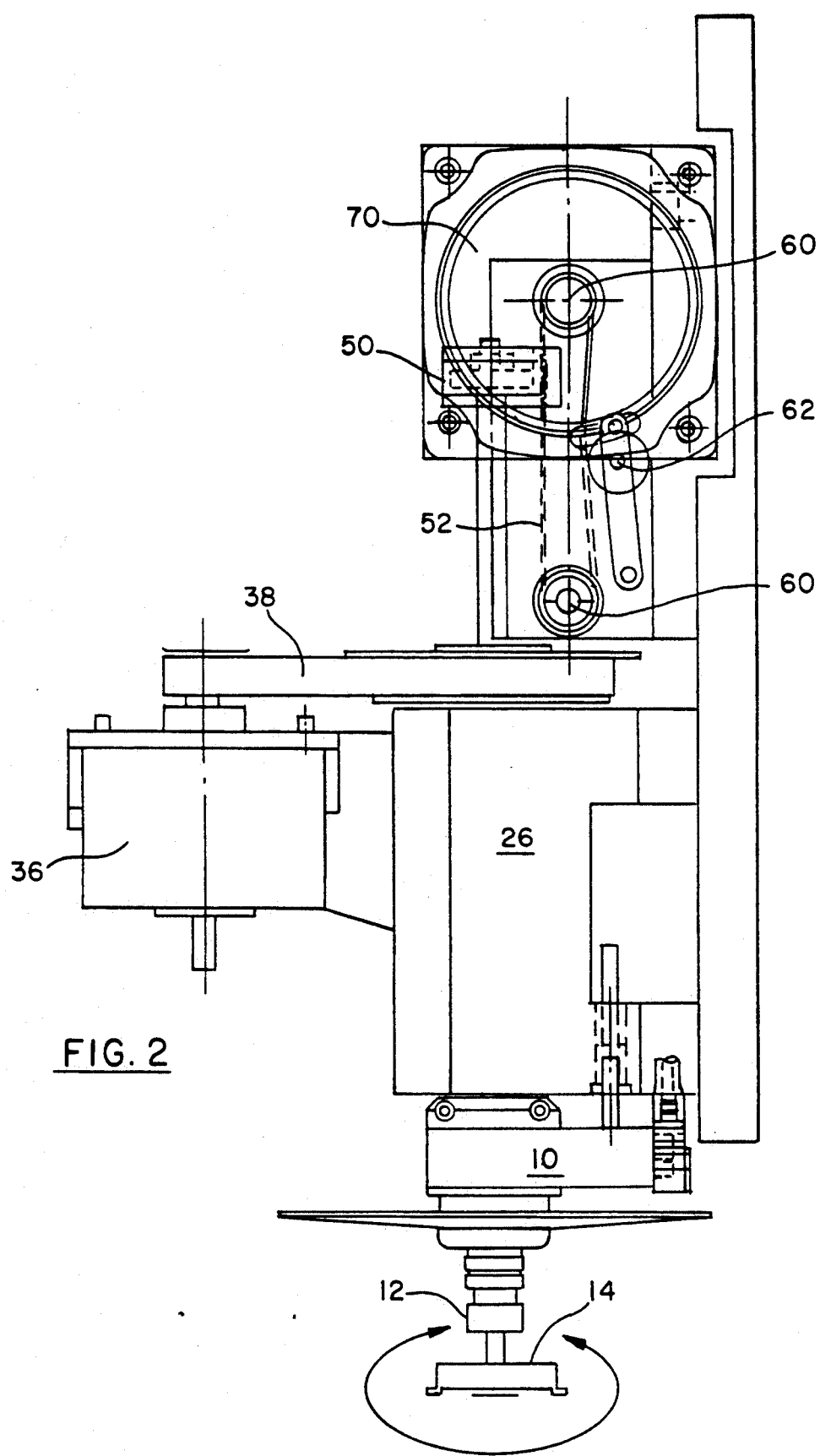

Referring to the drawings:

FIG. 1 is an elevational cross-sectional view of a drive system for a tool head of a machine for placing surface mount components; and FIG. 2 is a view taken at 2—2 of FIG. 1.

A tool head 10 which has a tool 12 for engaging and holding a surface mount component 14 to be placed on a printed circuit board 15 is secured to a ball spline drive shaft 16. A pair of ball spline nuts 18 are located in spaced relation within the central bore 20 of the spline nut housing 21 and a pair of keys 22 lock the ball spline nuts 18 to the spline nut housing 21. A ball spline nut 18 has pockets 23 which hold steel balls 25 which ride along axial slots 27 defined in the ball spline shafts 16 (only one enlarged pocket slot is shown for purposes of clarity. Further details of a ball spline unit are disclosed in U.S. Pat. No. 4,799,803. A pair of spaced radial bearings 24 which are supported by the theta housing 26, rotatably support the spline nut housing 21 and are preloaded by compressively locating a wave spring washer 28 between the upper radial bearing and the theta timing belt pulley 30 which has a central threaded bore 32 threadedly received by the threaded end 34 of the spline nut housing 21. When the theta stepping motor 36 (FIG. 2) is driven, the timing belt 38 is driven to rotate the pulley 30 and hence the tool head about the axis of the ball spline 16 (theta motion).

A clamp 50 which is secured to the Z axis timing belt 52 supports a radial bearing 53 which receives a reduced diameter portion 54 adjacent the threaded end 56 of the ball spline. A suitable nut 58 secures the ball spline to the radial bearing. The Z axis timing belt 52 is supported between spaced pulleys 60 and is tensioned by an idler shaft 62. A second stepping motor 70 secured to the Z axis housing rotatively drives the upper pulley so that Z axis motion may take place conjointly with theta motion.

We claim:

1. A machine for placing surface mount electronic components on a printed circuit board comprising
 a tool holder for holding a vacuum tool and
 means for supporting said tool holder for conjoint displacement along and around a selected axis including
 a ball spine shaft secured at one end to said tool holder,
 ball spline nut means operatively coupled to said ball spline shaft,
 means for rotationally supporting said ball spline nut means,
 means for selectively rotating said ball spline nut means, and
 means for axially displacing said ball spline shaft including
 a timing belt,
 means for selectively displacing said timing belt means,
 a clamp secured to said timing belt and including a rotary bearing for receiving the other end of said ball spline shaft.

2. A machine for placing surface mount electronic components on a printed circuit board according to claim 1 wherein said ball spline nut means includes a pair of ball spline nuts and said rotationally supporting means comprises a housing for supporting said ball spline nuts.

3. A machine for placing surface mount electronic components on a printed circuit board according to claim 2, further comprising means for rotationally supporting said spline nut housing and a pulley secured to one end of said spline nut housing.

* * * * *